United States Patent [19]
Gouin et al.

[11] 3,978,509
[45] Aug. 31, 1976

[54] PHOTOSENSITIVE SEMICONDUCTOR DEVICE

[75] Inventors: Christian Gouin, Herouville; Gerard Gimine, Caen, both of France

[73] Assignee: U.S. Philips Corporation, New York, N.Y.

[22] Filed: Apr. 18, 1975

[21] Appl. No.: 569,221

Related U.S. Application Data

[63] Continuation of Ser. No. 365,219, May 30, 1973, abandoned.

[30] Foreign Application Priority Data

June 2, 1972 France............................ 72.19924

[52] U.S. Cl.................................... 357/30; 357/58; 357/64; 357/88; 357/89
[51] Int. Cl.².................. H01L 27/14; H01L 29/167
[58] Field of Search ................... 357/30, 64, 89, 88, 357/58

[56] References Cited
UNITED STATES PATENTS 3,668,555   6/1972   Kasperkovitz................... 331/107 R Primary Examiner—Martin H. Edlow
Attorney, Agent, or Firm—Frank R. Trifari; Leon Nigohosian

[57] ABSTRACT

A semiconductor device having a photosensitive semiconductor element, for example a photoresistor, having a photosensitive layer of high-ohmic material, preferably gold-compensated silicon, which is present on a high-ohmic substrate region and which is covered with a highly doped semiconductor surface layer.

According to the invention, an epitaxial intermediate layer is present between the substrate region and the photosensitive layer and has a resistivity which lies between that of the photosensitive layer and that of the substrate region, while the surface layer, which is preferably partly etched away prior to the provision of the electrode, is grown epitaxially on the photosensitive layer.

10 Claims, 5 Drawing Figures

PHOTOSENSITIVE SEMICONDUCTOR DEVICE

This is a continuation of application Ser. No. 365,219, filed May 30, 1973, now abandoned.

BACKGROUND OF THE INVENTION

The invention relates to a semiconductor device having a photosensitive semiconductor element comprising a semiconductor body having a monocrystalline substrate region of low resistivity, an epitaxial photosensitive layer of compensated semiconductor material of very high resistivity, a first non-rectifying contact on the substrate region, and a second non-rectifying contact on the photosensitive layer.

The above used expression "compensated semiconductor material" means in this context a semiconductor material of very high resistivity which is obtained by compensation as a result of a suitable doping with an element having an active energy level which preferably lies in the vicinity of the centre of the forbidden band of the said semiconductor material. Such a high resistivity compensated material may be of the $n$ type or $p$ type conductivity, according to whether the remaining non-compensated majority charge carriers are electrons or holes.

The invention relates in particular to a photosensitive resistor the photosensitive material of which is gold-compensated silicon.

It is known that the conventional semiconductor photoresistors generally show comparatively large response times (in the order of a few tens of microseconds or even a few milliseconds), in which the response time is defined as the time interval which elapses between the instant at which radiation begins to impinge on the photoresistor and the instant at which said photoresistor reaches the equilibrium value which corresponds to the said radiation.

It has been found, however, that gold-compensated silicon photoresistors may have a response time in the order of one microsecond or less.

A photoresistor of this type is described in the U.S. Pat. specification No. 3,436,613. According to this patent specification, an $n$ type conductive photosensitive layer is formed, by epitaxial growth, on a substrate of a highly doped silicon and is then provided with a likewise highly doped surface layer which is obtained by diffusion. The necessary contacts are provided on the one hand on the substrate and on the other hand on the said surface layer.

The photosensitive layer is compensated with gold by diffusing said metal from the surface of the said surface layer, the electrically active gold concentration being such as to be approximately equal to three times the concentration of the donor atoms in the photosensitive layer.

The response time of a photoresistor obtained according to the above-described structure is approximately 1 microsecond.

However, the great drawback of such a photoresistor is its non-linearity.

It is known that the non-linearity of a photoresistor can be reduced by increasing the thickness of the photosensitive layer of said resistor, but the increase in said thickness has the inevitable drawback that the amplification of the device decreases (it is known that said amplification is inversely proportional to the thickness of the sensitive layer).

On the other hand, a photoresistor in which the gold concentration is significantly larger than the donor concentration of the photosensitive layer and is even equal to three times the said donor concentration, as is the case in the device described here, has a very high and substantially constant value.

On the other hand, Applicants have observed that at lower gold concentrations it is substantially impossible with the structure described to give the dark current resistance the desired value and that the spread of the resulting photoresistors is very large. This is a drawback which hampers the industrial manufacture of said type of photoresistors.

It should also be taken into account that the electric contact on the said surface layer which is considerably disturbed as a result of the gold diffusion does not have the desired quality and that the value of the photoresistor can thus vary with the direction followed by the current flowing through the photoresistor. It has also been found that, due to the poor quality of the said contact, a high offset voltage remains, which means that the value of the voltage extrapolated to a current zero is not equal to zero.

One of the objects of the invention is to prevent or reduce the drawbacks associated with the described known device. The photosensitive semiconductor device according to the invention has a rapid response and a good linearity.

Another object of the invention is to provide a photosensitive semiconductor device having a photosensitive layer of gold-compensated silicon which can be manufactured on an industrial scale and in a reproducible manner.

The invention is based inter alia on the recognition of the fact that the linearity, the possibility of adjusting the desired ohmic base value, and the reproducibility of a photoresistor comprising a compensated photosensitive layer are determined to a considerable extent by the homogeneity of the distribution of the compensating element at the various levels of the structure.

In particular when gold is used as an acceptor for compensating an epitaxial layer of $n$-conductive silicon and in view of the fact that gold is an element which has a very strong tendency of fixing preferably everywhere where crystal defects occur, for example, at the surface, at interfaces with great disturbances and in diffused zones, the structure and the manufacture of the said device will have to be such that the number of impurity centres is as small as possible.

SUMMARY OF THE INVENTION

According to the invention, a semiconductor device having a photosensitive semiconductor element is therefore characterized in that the high-resistivity photosensitive layer is provided on an epitaxial intermediate layer which is provided on the substrate region and has a resistivity which lies between that of the substrate region and that of the photosensitive layer and that the high-resistivity photosensitive layer is covered at least partly with an epitaxial semiconductor surface layer of low resistivity.

The structure according to the invention generally enables the manufacture of compensated photoresistors which have a good linear characteristic. This advantage is to be ascribed at least partially to the fact that the great disturbances between the substrate region and the photosensitive layer are strongly reduced by the presence of the epitaxial intermediate layer.

Actually, the fact that there is provided between the substrate region and the photosensitive layer an intermediate layer, whose resistivity has a value which lies between the considerably varying resistivity values of the substrate region and the photosensitive layer, will result in a decrease of the crystalline discontinuity. Since in addition the provision of the intermediate layer and of the sensitive layer takes place by epitaxial growth, the concentration gradients of the dopings used may show a certain continuity.

On the other hand, the linearity is considerably improved by providing a highly doped epitaxial surface layer on the photosensitive layer, said epitaxial surface layer contributing to the regular distribution of the compensation element over the thickness of the photosensitive layer.

In fact, the interface between the said surface layer and the photosensitive layer, which layers are both formed epitaxially and which may be provided in a continuous manner notwithstanding their varying resistivity values, is less disturbed than the interface between a photosensitive layer and a layer which is directly diffused in said sensitive layer as is the case in the described known device. So the photosensitive layer shows a better homogeneity.

The epitaxial surface layer through which an element is diffused for compensating the photosensitive layer is preferably subjected to an etching treatment prior to providing the contact electrode on the surface layer.

The object of said etching treatment is the removal from the said surface layer of a surface zone which is highly disturbed after diffusion of the compensation element so as to obtain in this manner an electric contact of good quality.

The structure of the semiconductor device according to the invention enables an optimum compromise between the linearity on the one hand and the photo gain on the other hand. The compensation homogeneity which is obtained by reducing the number of crystal defects at the interfaces of the successively provided layers, preferably combined with the removal of a surface zone of strong concentration of the compensation element, make it possible to give the photosensitive layer an optimum thickness which is compatible with the desired photogain without reducing the linearity.

A further advantage of the structure of the photosensitive semiconductor device according to the invention is that reproducible resistance values can more easily be obtained with it, which is also a result of the better homogeneity of the sensitive layer. The reproducibility is maintained also for comparatively small resistance values which correspond to compensating impurity concentrations in the order of the concentration of the conductivity type-determining doping patterns of the photosensitive layer, which, as already described, is not the case with known structures.

A semiconductor device according to the invention having a photoresistor comprising gold-compensated silicon has both a small response time which is characteristic of the combination silicon-gold and a good linearity and a good photogain.

The invention furthermore relates to a method of manufacturing such a device, which method is characterized in that the intermediate layer, the photosensitive layer and the semiconductor surface layer are provided successively in the same epitaxial growth process, the surface layer obtaining an original thickness of at least 5 microns and at most 10 microns, the compensating element being then introduced into the photosensitive layer by diffusion from one of the surfaces of the resulting structure. Silicon is preferably used as a semiconductor material and gold is preferably used as a compensating element.

As already stated, the surface layer preferably is partly etched away after indiffusing the compensated element, after which an electrode layer is provided in the etched surface.

A further important preferred embodiment is characterized in that after the gold diffusion the surface layer is etched down to a thickness of at least 3 and at most 5 microns, that a metal layer is then provided on said layer and is then given the desired electrode pattern, after which the parts of the surface layer not covered by the metal layer are etched again until the thickness of the surface layer is at most 1 micron.

The manufacture could be carried out more rapidly when, via a single etching treatment, the thickness of the surface layer could be reduced directly to 1 $\mu$u, while subsequently the metal layer is provided and the contact formed. However, in that case the contact would on the one hand be less desirable due to the fact that it is provided on a less favourable level of the epitaxial surface layer and on the other hand can be provided with greater difficulty due to the fact that the underlying base is thinner and hence more vulnerable, which could reduce the quality of the photosensitive layer. could reduce the quality of the photosensitive layer.

BRIEF DESCRIPTION OF THE DRAWINGS

The invention will now be described in greater detail with reference to an embodiment and the drawing, in which.

PREFERRED EMBODIMENT

Figure 1A:
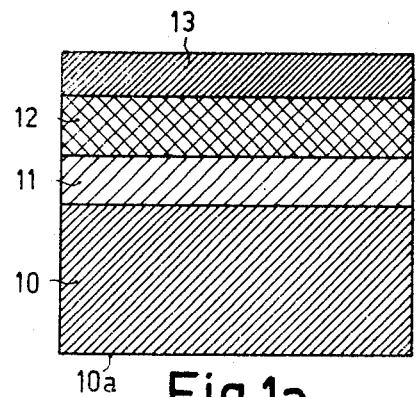
FIGS. 1a to 1c are diagrammatic cross-sectional views of photosensitive semiconductor devices according to the invention in three successive stages of manufacture.

FIG. 1a shows the photosensitive semiconductor device which in this case is, for example, a photoresistor of gold-compensated silicon, at the instant at which via epitaxial growth from the gaseous phase, the intermediate layer 11, the photosensitive layer 12 and the surface layer 13 in this sequence are provided on the substrate (in the form of a silicon plate 10).

The substrate 10 which is a monocrystalline silicon plate is preferably $n$ conductive and has an average doping of $5 \times 10^{18}$ donor atoms/cm$^3$ so that the silicon has a resistivity in the order of 0.01 ohm cm.

The method of providing thin layers via epitaxial growth from the gaseous phase is well-known and can be carried out accurately; the assembly formed by the structure may be manufactured in one continuous process.

The $n$ conductive epitaxial intermediate layer 11 is, for example, doped with arsenic to a concentration of $10^{16}$ to $5 \times 10^{17}$ atoms/cm$^3$, so that said intermediate layer has a resistivity of approximately 0.15 Ohm.cm. The thickness of the said zone is between 5 microns and 20 microns; the optimum thickness of said zone in the case of a photoresistor having gold-doped silicon is approximately 15 microns.

The photosensitive layer 12 is also doped with arsenic in a concentration which, however, is lower as compared with that of the layer 11, namely in the order of $5 \times 10^{14}$ to $5 \times 10^{15}$ atoms/cm$^3$. For that purpose it is sufficient to reduce the supply of arsenic in the reactor used. The resistivity which corresponds to an arsenic concentration of $10^{15}$ atoms/cm$^3$ is approximately 1.5 ohm.cm. The thickness of the layer 12 is determined in accordance with the electric resistance which it is desired to obtain and which provides a photo gain which is as large as possible. A thickness between 10 and 20 microns provides a photoresistor of gold-compensated silicon. The base value (at dark current) is in the order of 300 ohm to 400 ohm.

For doping the epitaxial surface layer 13 which is also n type conductive, arsenic or preferably phosphorus is used since said substance can provide a higher doping concentration. The doping of said surface layer 13 should be very high so as to obtain a low resistivity and to enable the provision of a good ohmic contact. A doping concentration of at least $10^{20}$ atoms/cm$^3$ is desired for the said layer 13 which in that case has a resistivity in the order of 0.001 ohm cm. After the epitaxial growth, the thickness of the layer 13 is between 5 and 10 microns (preferably 7 microns).

It is to be noted that the conditions in which the three epitaxial zones are provided should be such that the concentration variations between successive layers are more or less continuous so as to avoid crystal defects at the interfaces as much as possible. Actually, such crystal defects may be the cause of all kinds of irregularities, in particular with respect to the linearity of the resistor.

The photoconductive semiconductor device composed according to FIG. 1a is provided with a very thin layer of gold (0.02 to 0.2 micron) which is provided via vapour deposition either on the layer 13 or on the surface 10 a of the substrate 10, the plate being heated to a temperature of approximately 110°C. The device is then disposed in a furnace at a temperature of 410°C for 15 to 20 minutes so as to form a gold-silicon alloy.

The plate is then placed in a diffusion furnace. During the diffusion, the compensation atoms diffuse in such manner that the concentration is approximately homogeneous throughout the structure. However, the diffusion is controlled so that the gold doping is substantially of significance only in the layer 12 where the n type doping is low, in which in this example the gold dopings has a value of approximately $10^{15}$ atoms/cm$^3$ which corresponds to the donor concentration in the said layer 12. The gold concentration is mainly determined by the temperature in the diffusion furnace and said temperature may vary between 900° and 1200°C (1030°C for 20 minutes with a gold concentration of $10^{15}$ atoms/cm$^3$). As already stated it is no longer possible above a degree of compensation = 1 (degree of compensation = donor concentration) to obtain a good reproducibility of the photoresistors. Also, above such degree of compensation the danger exists that the conductivity type of the photosensitive layer varies and p-n junctions are formed so that the photoresistors obtain particularly poor properties.

In order to carry out the compensation in the best possible conditions, it is necessary to perform preceding measurements of structures which were diffused with gold at different temperatures and for different times. These measurements can be carried out according to generally used methods, for example, by gamma spectrometry or by measurement of the spreading resistance. It has been found that the diffusion and the ultimate concentrations are substantially not influenced by the thickness of the provided gold layer.

The gold diffusion varies the initial resistivity of the layer 12 considerably and said resistivity stabilizes between $10^2$ and $10^4$ ohm cm in accordance with the gold concentration. The gold diffusion does not noticeably influence the resistivity of the other layers of the structure.

After the gold diffusion, a considerable increase of the gold concentration at the surface of the layer 13 was measured. This phenomenon which is very characteristic of the behaviour of gold is particularly noticeable in the described case in which the layer 13 is initially strongly n conductive which increases the maximum acceptor concentration.

So the layer 13 is considerably disturbed in the vicinity of the surface and said disturbance continues down to a depth of at least 2 microns. Before proceeding to the provision of the electrodes it is desirable to eliminate the said disturbed zone.

Figure 1B:
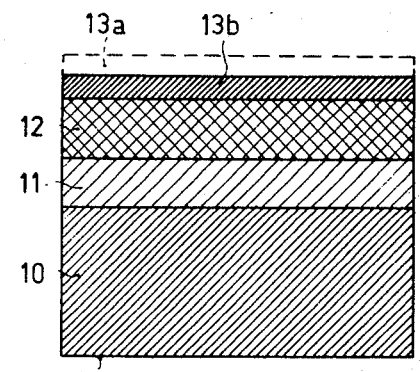

Via a first etching treatment, the part 13a of the layer 13 is removed the thickness of which on the remaining part 13b is reduced to a value between 3 and 5 microns (see FIG. 1b). The etching treatment is carried out in the usual manner, for example, by immersing the structure in a mixture of hydrofluoric acid and nitric acid for approximately 3 minutes.

Figure 1C:
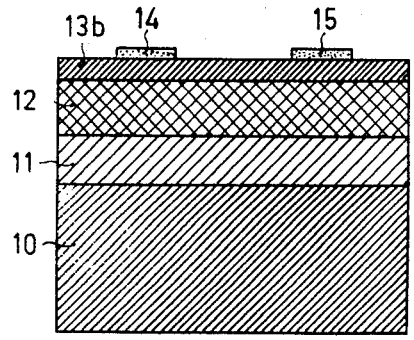

The surface of the zone 13b is then provided with an aluminium layer via vapour deposition. The aluminium layer which covers said zone 13b is etched away photolithographically so as to form the electrodes, for example, the metal layer parts 14 and 15 (see FIG. 1c); generally, a continuous electrode or contact grid is formed the configuration of which is such that the photosensitive layer can be exposed to the radiation in the correct manner and substantially equal potential distribution is obtained throughout the surface of said sensitive layer.

The contact electrode which is provided on the surface of the face 10a of substrate region 10 is formed only at the instant of the provision of the connection between the said substrate and the supporting plate. The said second contact electrode and the said supporting plate are not shown in the Figures.

The zone 13b is finally subjected to a last etching treatment which reduces the thickness of said zones to a maximum value of 1 micron. Of course, said second etching treatment is slightly more difficult to realize than the first, due to the fact that the photosensitive layer 12 is present in the immediate proximity. The said second etching treatment is carried out for 2 minutes in the above-mentioned solution. Of course, the etchant may not attack the provided aluminium layer.

Figure 1D:
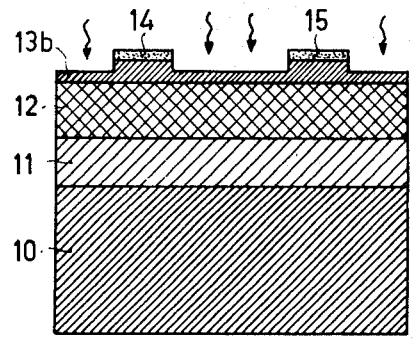
FIG. 1d is a diagrammatic cross-sectional view of the ultimately obtained structure of the said device.

FIG. 1d shows the resulting semiconductor device according to the invention.

Figure 2:
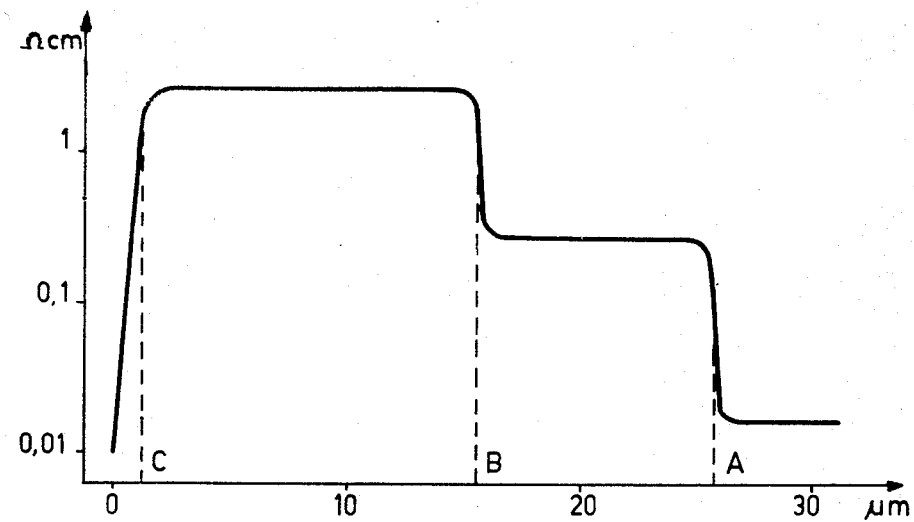
FIG. 2 is a graph showing the variation of the resistivity in the various provided zones which form the structure shown in FIG. 1d.

The graph shown in FIG. 2 illustrates the values of the resistives in ohm.cm which are measured at the various levels of a photoresistor structure of gold-doped silicon manufactured according to the invention.

The vertical broken lines denote at A the average boundary face between the substrate 10 and the epitaxial intermediate layer 11, at B the average boundary face between the layer 11 and the photosensitive layer 12, at C the average boundary face between the layer 12 and the epitaxial surface layer 13b, while the origin 0 of the x-values corresponds to the free surface of the layer 13b between the electrodes (14 and 15).

The object of this graph which, however, is no exact reproduction as regards the resistivity values themselves, is to demonstrate that on the one hand said values are very homogeneous over the thickness of the various provided layers, at least at a sufficient distance from the boundary faces between said layers (of course the thin zone 13b excepted in which the resistivity varies very rapidly) and that on the other hand at the boundary faces the variations of the resistivity, although considerable, are nevertheless continuous; as already stated, this is necessary to obtain a structure the resistance of which remains constant with otherwise the same conditions in accordance with the current or the voltage applied.

It will be obvious that the invention is not restricted to the embodiment described but that many variations are possible to those skilled in the art without departing from the scope of this invention. For example, compensating elements other than gold and semiconductor materials other than silicon may be used. The compensating element may also be provided by a method other than diffusion, for example, by ion implantation. Furthermore, the photosensitive element may form part of a semiconductor body which also comprises other semiconductor circuit elements.

What is claimed is:

1. A semiconductor device having a photosensitive semiconductor element comprising a semiconductor body having a monocrystalline substrate region of low resistivity, and epitaxial photosensitive layer of doping material-compensated semiconductor material of a very high resistivity, an epitaxial intermediate layer disposed directly between and having a resistivity which lies between that of said substrate region and said photosensitive layer, an epitaxial semiconductor surface layer of low resistivity disposed over and at least partly covering said photosensitive layer, a first non-rectifying electrical contact on said substrate region, and a second non-rectifying electrical contact for said photosensitive layer.

2. A semiconductor device as in claim 1, wherein said substrate region and said semiconductor layers provided thereon are all n-type and said photosensitive layer consists essentially of a semiconductor material which is compensated with a doping material having an active energy level near the center of the forbidden band of said semiconductor material.

3. A semiconductor device as in claim 2, wherein said substrate region and said semiconductor layers provided thereon are of silicon and said compensating doping material is gold.

4. A semiconductor device as in claim 3, wherein the level of said compensating doping material of said photosensitive layer is substantially equal to that of the donor concentration on said layer.

5. A semiconductor device as in claim 4, wherein said doping concentration of said substrate region is approximately $5 \times 10^{18}$ atoms/cm$^3$, the average doping concentration of said intermediate layer is at least $10^{16}$ and at most $5 \times 10^{17}$ atoms/cm$^3$ and the doping concentration of the epitaxial semiconductor surface layer is at least $10^{20}$ atoms/cm$^3$.

6. A semiconductor device as in claim 5, wherein said intermediate layer has a thickness of at least 5 and at most 20 microns, said photosensitive layer has a thickness of at least 10 microns and at most 20 microns, and said semiconductor surface layer has a thickness of at most 1 micron.

7. A method of manufacturing a semiconductor device as recited in claim 1, comprising the steps of providing successively in the same epitaxial growth process on said substrate said intermediate layer, photosensitive layer and semiconductor surface layer, such that surface layer has an original thickness of at least 5 microns and at most 10 microns, and then introducing said compensating doping material in the photosensitive layer by diffusion from one of the surfaces of the resulting structure.

8. A method as in claim 7, wherein silicon is used as a semiconductor material and gold is used as said compensating doping material.

9. A method as in claim 7, wherein, after the indiffusion of said compensating doping material said surface layer is partly etched away and then an electrode layer is provided on the etched surface.

10. A method as in claim 9, wherein, after the step of indiffusing said gold, said surface layer is etched down to a thickness of at least 4 and at most 5 microns, a metal layer on the remaining part of said surface layer, then shaping said metal layer in the desired electrode pattern, and then further etching parts of the surface layer not covered by said metal layer until the thickness of the remaining part of said surface layer is at most 1 micron.

* * * * *

UNITED STATES PATENT AND TRADEMARK OFFICE
CERTIFICATE OF CORRECTION

PATENT NO. : 3,978,509
DATED : August 31, 1976
INVENTOR(S) : CHRISTIAN GOUIN ET AL It is certified that error appears in the above-identified patent and that said Letters Patent are hereby corrected as shown below:

Col. 4, line 20, "μu" should be --μ--;

line 29, delete "could reduce the quality of the photosensitive--;

line 30, delete "layer".

Signed and Sealed this

Tenth Day of May 1977

[SEAL]

Attest:

RUTH C. MASON
*Attesting Officer*

C. MARSHALL DANN
*Commissioner of Patents and Trademarks*